United States Patent [19]

Kotzin et al.

[11] Patent Number: 5,392,044
[45] Date of Patent: Feb. 21, 1995

[54] METHOD AND APPARATUS FOR DIGITIZING A WIDE FREQUENCY BANDWIDTH SIGNAL

[75] Inventors: Michael D. Kotzin, Buffalo Grove; Joseph J. Schuler, Roselle, both of Ill.

[73] Assignee: Motorola, Inc., Schaumburg, Ill.

[21] Appl. No.: 27,306

[22] Filed: Mar. 8, 1993

[51] Int. Cl.⁶ ............................................. H03M 1/12
[52] U.S. Cl. ...................................... 341/155; 381/37
[58] Field of Search ................................. 341/50, 155

[56] References Cited

U.S. PATENT DOCUMENTS

| | | | |
|---|---|---|---|
| 4,048,443 | 9/1977 | Crochiere et al. | 179/1 SA |
| 4,918,524 | 4/1990 | Ansari et al. | 358/133 |
| 4,969,040 | 11/1990 | Gharavi | 358/136 |
| 5,073,938 | 12/1991 | Galand | 381/34 |
| 5,115,240 | 5/1992 | Fujiwara et al. | 341/51 |
| 5,230,038 | 7/1993 | Fielder et al. | 395/2 |
| 5,241,535 | 8/1993 | Yoshikawa | 370/60 |

OTHER PUBLICATIONS

Vaidyanathan, P. P., "Quadrature Mirror Filter Banks, M-Band Extensions and Perfect-Reconstruction Techniques", *IEEE ASSP Magazine*, Jul. 1987, pp. 4-20.

Rothweiler, Joseph H., "Polyphase Quadrature Filters-A New Subband Coding Technique", *ICASSP 83, Boston*, 1983, Sponsored by: IEEE, pp. 1280-1283.

Vaidyanathan, P. P., "Theory and Design of M-Channel Maximally Decimated Quadrature Mirror Filters with Arbitrary M, Having the Perfect-Reconstruction Property", *IEEE Transactions on Acoustics, Speech, and Signal Processing*, vol. ASSP-35, No. 4, Apr. 1987, pp. 476-492.

Millar, Paul C., "Recursive Quadrature Mirror Filters--Criteria Specification and Design Method", *IEEE Transactions on Acoustics, Speech, and Signal Processing*, vol. ASSP-33, No. 2, Apr. 1985, pp. 413-420.

Vaidyanathan, P. P. and Swaminathan, Kumar, "Alias-Free, Real-Coefficient m-Band QMF Banks for Arbitray m", *IEEE Transactions on Circuits and Systems*, vol. CAS-34, No. 12, Dec. 1987, pp. 1485-1496.

Bjerede, B. E., Bartlow, G., Bartley, T., Clayton, K., Fisher, G., Smith, C., "Digital Processing Receiver", Prepared for: Rome Air Developement Center, Feb. 1975, Distributed by: National Technical Information Service, U.S. Department of Commerce.

*Primary Examiner*—Marc S. Hoff
*Attorney, Agent, or Firm*—Shawn B. Dempster; Kevin A. Buford

[57] ABSTRACT

A method and apparatus are provided for digitizing a wide frequency bandwidth signal (105). The digitizing is accomplished by separating the wide frequency bandwidth signal (105) into a plurality of narrow frequency bandwidth signals with a plurality of filters (110). Subsequently, a converter (120) generates digitized samples of the narrow frequency bandwidth signals. Finally, a composite digitized signal (160) is generated by a combiner (150) from the digitized samples which substantially represents the wide frequency bandwidth signal (105).

10 Claims, 3 Drawing Sheets

METHOD AND APPARATUS FOR DIGITIZING A WIDE FREQUENCY BANDWIDTH SIGNAL

FIELD OF THE INVENTION

The present invention relates to digitizers which must digitize a wide frequency bandwidth signal for subsequent digital signal processing, and more specifically to a digitizer for a wide frequency bandwidth signal without the need for digitizing hardware which operates at or above the Nyquist sampling rate for the signal to be digitized.

BACKGROUND OF THE INVENTION

The maximum operating speed of digitizers establishes a limit for many systems on the maximum frequency bandwidth of a signal that can be digitized; however, once digitized, processing of the signal may proceed at whatever rate is appropriate.

It will be appreciated by those skilled in the art that any signal may be digitized and the resulting digital representation of the signal used in a variety of signal processing algorithms for various purposes. For example, digital signal processing algorithms exist for the filtering of a signal and the demodulation of a signal. Further, in order for a digitizer to properly represent a signal in its digitized form as a sampled low pass signal, the digitizer must operate at a sampling rate at least equal to twice the highest frequency component of the signal. Similarly, the digitizer must sample at least twice the maximum bandwidth of the signal, if it is a bandpass signal. This minimum sampling rate is also known as the Nyquist sampling rate. By digitizing a signal at the Nyquist sampling rate, the signal is assured of being able to be represented uniquely in a digitized form without aliasing of the signal frequency components. When such a unique representation is provided, the signal may be completely reconstructed into its original form without loss of information. Otherwise if a slower rate of sampling is used on a signal, false information may be included in the sampled signal information. This false information is caused by aliasing (also known as foldover) which occurs when a high-frequency component in the spectrum of a signal being sampled apparently takes on the identity of a lower frequency in the spectrum of a sampled version of the signal.

Digitizing a signal can be conveniently performed by an analog-to-digital converter which is preceded by an appropriate anti-aliasing filter. The combination of these two signal processing elements are typically referred to as a digitizer. A digitizer accepts an input analog signal that is first filtered to restrict the bandwidth of the signal to prevent aliasing during a subsequent sampling process. The filtered signal is then sampled to generate a digital representation of the input signal's amplitude at different points in time at a rate which is generally determined by a system sampling clock. When the sampling clock occurs at a periodic rate, the signal is said to be sampled at a uniform rate. Other techniques such as sampling at non-uniform rates, where the sampling may not occur at regular intervals in time, also exist; however, the extension of the following inventive concepts from uniform to non-uniform sampling rates would be understood by those skilled in the art.

Digitizers are characterized by a variety of specifications, typically the maximum sampling rate in samples per second and the number of bits of resolution which can be generated. The sampling rate must be at least equal to the Nyquist rate and preferably higher than this to ease the anti-aliasing filtering requirements of the digitizer. An anti-aliasing filter is placed ahead of the digitizer to limit the bandwidth of the signal (i.e., attenuate the out-of-band high frequency signal components) such that the Nyquist criterion is met with a given sampling rate. Additionally, it is generally desirable to provide the maximum number of bits of resolution possible so the signal can be accurately digitized with the least amount of quantization error. Quantization error can occur when sampled values of a continuous message signal are rounded off to the nearest representation level. Unfortunately, a high number of bits of resolution and a high sampling rate are contradictory design goals and compromises often must be made in the digitizer design process.

A variety of techniques are available to sample wide frequency bandwidth signals. One known technique is to simply increase the sampling rate to very high values, often measured in hundreds of Megasamples per second. Unfortunately, this wide bandwidth sampling is achieved at the expense of consuming greater levels of power and providing lower resolution than typically desired. The digitizers generally have high power dissipation levels, because, even if the devices are fabricated with low power Complementary Metal Oxide Semiconductor (CMOS) technology, the devices have a power dissipation which is proportional to the operating speed of the circuit. In addition, resolution also may suffer at the higher sampling rates due to inaccuracies generated in the analog-to-digital conversion process and the limitations on circuit operating speed. The highest rate digitizers are also expensive to manufacture and sometimes require extensive manual adjustments for optimum performance. Due to these design constraints, it will be appreciated by those skilled in the art that even with the fastest digitizers available, the maximum processing rate of a signal processing system may be limited not by the digital signal processing elements of the system but by the digitizer itself.

Another known technique samples repetitive signals through a relatively slow, but repetitive, random sampling process to synthesize the effect of a much higher sampling rate. This technique fails to provide an accurate digitized representation of an input signal when the signal to be digitized is not repetitive and is instead random or stochastic in nature. Wide bandwidth stochastic signals tend to be a significant portion of a typical signal communication. In some instances, the wide bandwidth stochastic signals are more common than repetitive signals. Therefore, a need exists for a wide bandwidth digitizer which utilizes lower power dissipation devices, which has a higher resolution, and which more accurately represents an input signal.

SUMMARY OF THE INVENTION

A method and apparatus are provided for digitizing a wide frequency bandwidth signal. The digitizing is accomplished by separating the wide frequency bandwidth signal into a plurality of narrow frequency bandwidth signals with a plurality of filters. Subsequently, a converter generates digitized samples of the narrow frequency bandwidth signals. Finally, a composite digitized signal is generated by a combiner from the digitized samples which substantially represents the wide frequency bandwidth signal.

DETAILED DESCRIPTION

Figure 1:
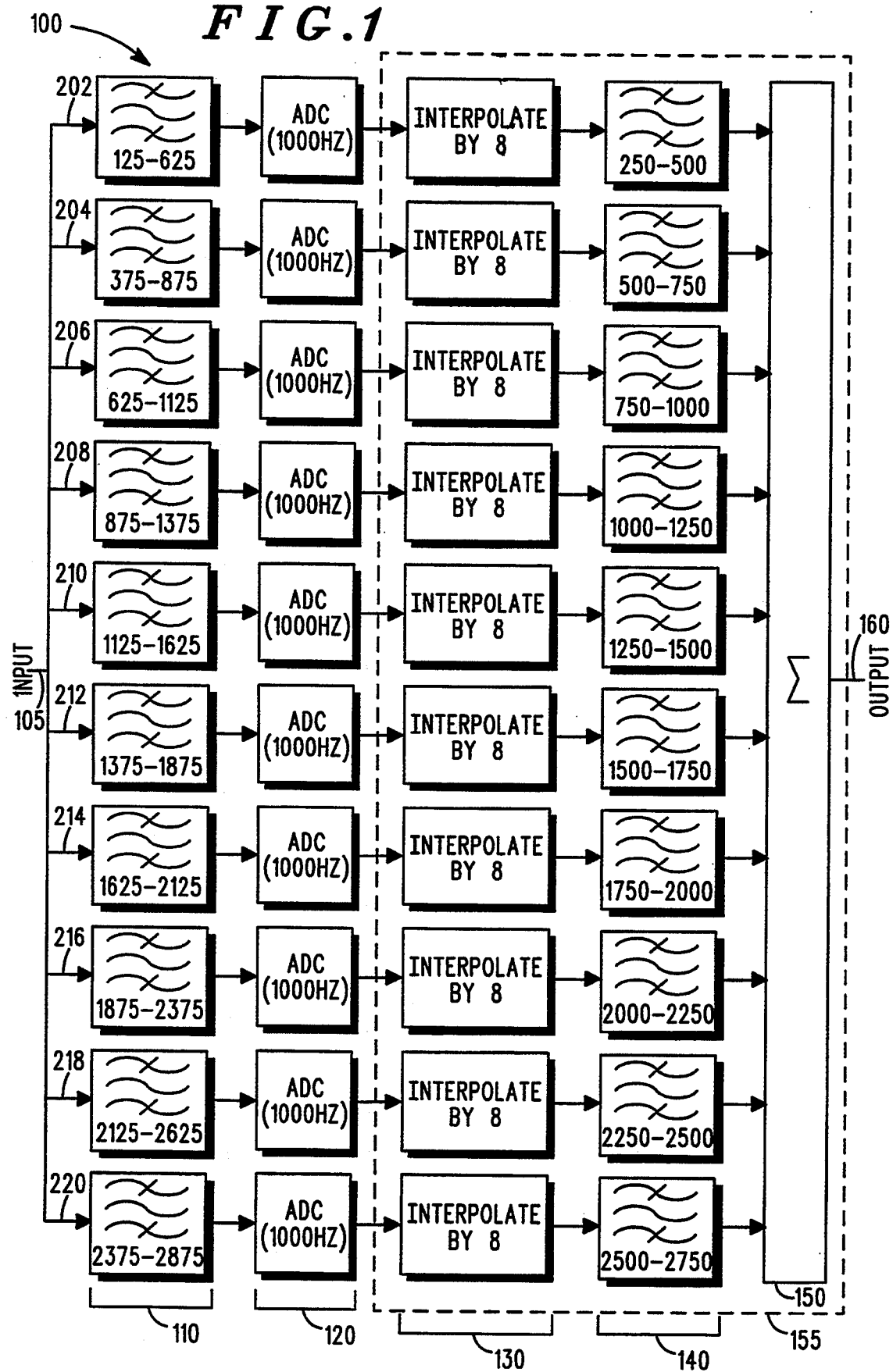
FIG. 1 is a block diagram showing a preferred embodiment of a digitizer in accordance with the invention.

A preferred embodiment of a digitizer in accordance with the invention 100 is shown in FIG. 1. The preferred embodiment digitizer 100 may be used in situations where digitizing hardware is not readily available to support the high sampling rates required of a wide frequency bandwidth digitizer. It will be appreciated by those skilled in the art that in order to properly digitally sample a signal, the sampling rate for that signal must be at least equal to and preferably greater than twice the bandwidth of the signal in order to meet the Nyquist criteria. A digitizer in the form of a single analog to digital converter that is capable of operating at a sufficiently high sampling rate for a wide bandwidth signal may not be practical or may not be technically achievable using state of the art design techniques.

The preferred embodiment digitizer 100 overcomes the limitations of other digitizes such that a wide frequency bandwidth signal 105 may be digitized by using analog-to-digital (A/D) converters that operate at much lower sampling rates than the Nyquist sampling rate criteria would suggest. The digitizer 100 takes advantage of the frequency domain representation of the received signal 105 through the configuration of a plurality of narrow bandwidth anti-aliasing filters 110 followed by slower speed sampling devices 120, such as A/D converters, that need only satisfy the Nyquist criteria for the narrow bandwidth of the preceding anti-aliasing filter 110. Each frequency selective filter 110 band limits the input to an A/D converter 120 such that each A/D converter 120 operates on a different narrow sub-band (i.e., narrowband signal path) of the total bandwidth of the signal 105 to be digitized. The resulting digitized data from all of these narrow bandwidth signal paths are combined 155 to form wideband digitized data 160 which represents all of the information contained in the originally received wide frequency bandwidth signal. Subsequently, digital signal processing techniques may then be used to perform other operations on the wideband digitized data 160 (e.g., decoding and detecting transmitted data bits from within the wideband digitized data 160).

Figure 2:
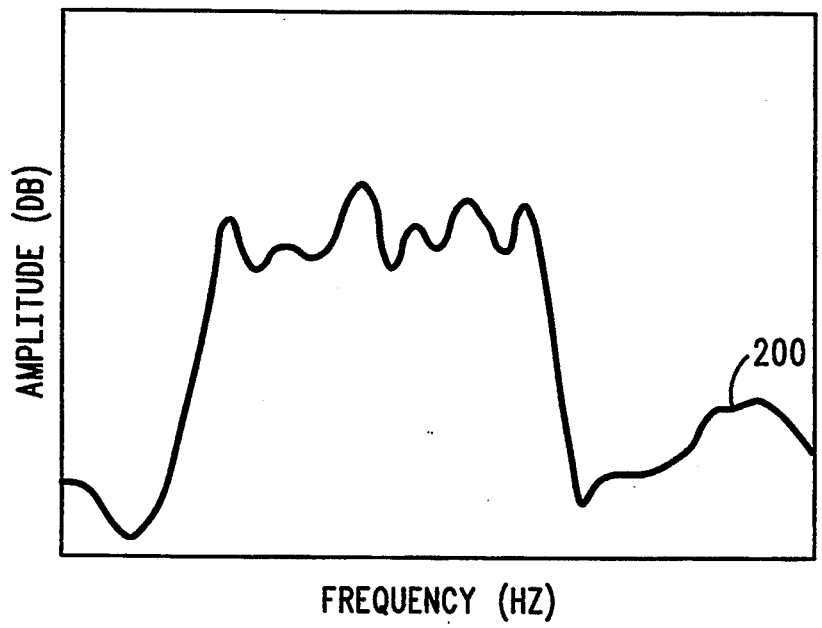
FIG. 2 shows a frequency domain representation of an electrical signal derived from an input received signal in accordance with a preferred embodiment of the present invention.
Figure 3:
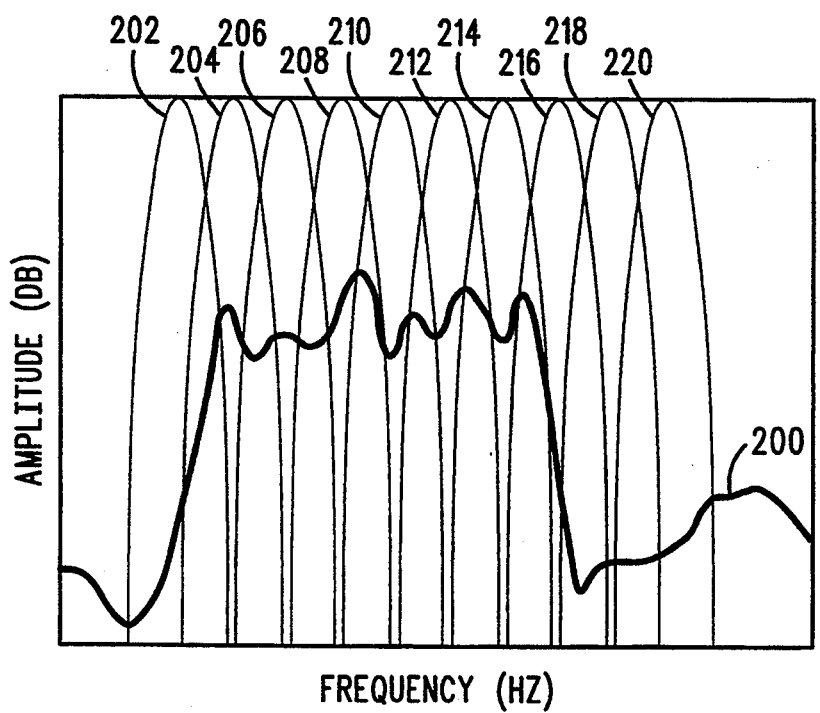
FIG. 3 shows a frequency domain representation of the electrical signal shown in FIG. 2 overlaid by ten analog narrow band overlapping channels which are combined in accordance with the preferred embodiment of the present invention to form a wide band channel.
Figure 4:
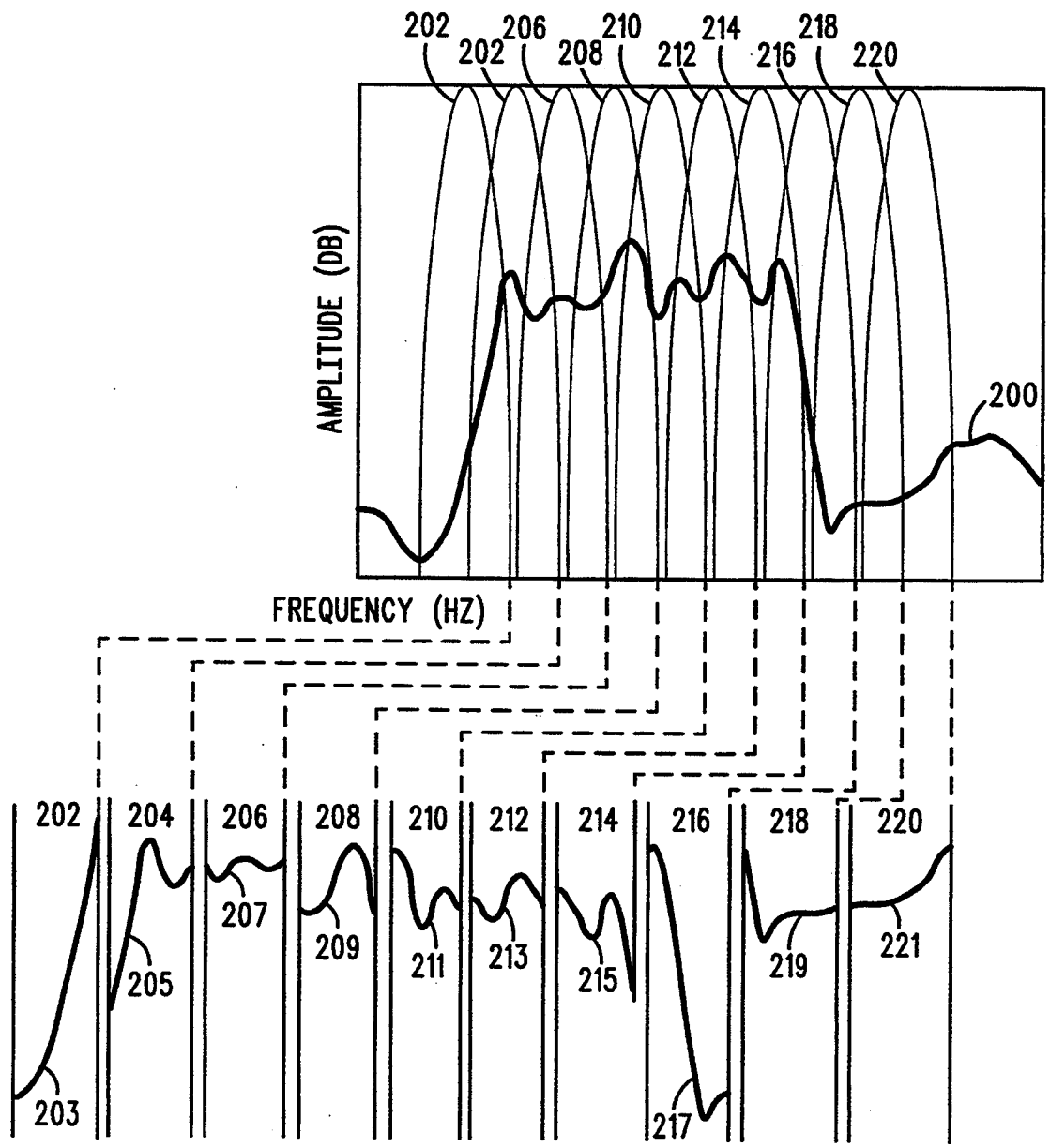
FIG. 4 shows which portion of the electrical signal shown in FIG. 2 is received by each analog narrow band overlapping channel shown in FIG. 3 in accordance with the preferred embodiment of the present invention.

By way of example, an electrical signal 200 is shown in FIG. 2. In the frequency domain, this electrical signal 200 represents the relative amplitude (i.e., vertical scale) of the frequency components (i.e., horizontal scale) of the received signal input by input 105. The electrical signal 200, carried on input 105, preferably is operatively coupled to the rest of the preferred embodiment digitizer 100 which digitizes a portion of the received signal 200 into a plurality of digitized signals. As shown in FIG. 3, the electrical signal 200 is divided, by the digitizer 100, into ten analog narrowband overlapping channels (i.e., narrowband signal paths) 202, 204, 206, 208, 210, 212, 214, 216, 218 and 220. These ten analog narrowband overlapping channels 202, 204, 206, 208, 210, 212, 214, 216, 218 and 220 preferably divide a portion of the electrical 200 into several overlapping signal portions (e.g., overlapping signals portions 203, 205, 207, 209, 211, 213, 215, 217, 219, and 221, respectively, as shown in FIG. 4). The overlapping signals portions 203, 205, 207, 209, 211, 213, 215, 217, 219, and 221 preferably are converted by analog-to-digital converters into a plurality of digitized signals. Subsequently, in the digital domain, the received signal narrowband components (i.e., digitized signals) are combined to form a composite wideband channel 160 (i.e., a composite wideband signal).

Referring now more particularly to FIG. 1, the preferred embodiment digitizer is described with respect to a signal constrained to the typical passband of a subscriber telephone line (i.e., the 250–2750 Hz (Hertz) frequency band). Since this signal's bandwidth is a total of 2500 Hz, a single A/D converter, having a minimum sampling rate of at least 5000 Hz, would be needed to accurately sample and digitize this signal waveform. However, it is not desired to use a single A/D converter, because of the relatively high sampling rate requirement.

Preferably, a digitizer 100 having a less stringent sampling rate requirement is used. In this preferred embodiment digitizer 100, a received wideband signal 105 enters a bank of analog anti-aliasing filters 110 (i.e., imperfect (brickwall) analog filters). The filter bank 110 acts to divide up the wideband signal 105 into a set of constituent narrower band analog signal paths. The desirable characteristics of each anti-aliasing analog filter 110 is that it has very high rejection to signals outside of its designated bandwidth (e.g., 500 Hz) and that it has good bandpass characteristics of relatively flat amplitude and group delay response only over about half of its bandwidth (e.g. the middle 250 Hz).

The outputs of each of these narrowband analog filters 110 is applied to a bank of sampling A/D converters 120, each of which comprises a sample and hold circuit, also commonly referred to simply as a sampler, followed by an analog to digital converter. It will be appreciated by those skilled in the art that if the conversion time of the analog to digital converters are sufficiently fast, then the sample and hold function may be omitted without loss of generality. Further, it should be appreciated that to avoid undesirable aliasing, the sample rate of the sampler 120 should be at least twice the bandwidth of the anti-aliasing filter 110. Thus, for the preferred embodiment analog anti-aliasing filters 110, a sampling rate of 1000 Hz is appropriate. The sampled outputs from each sampler 120 am passed to a respective A/D converter 120 which quantifies the samples and assigns a digital representation to each sample corresponding to the magnitude of the sample.

At this point, multiple A/D sample streams exist which represent a spectral segment (narrowband signal path) of the original wideband input signal 105. However, a single digital sampled signal 160 which accurately represents the original wideband input signal 105 is desired. This single digital sampled signal 160 is generated by appropriate digital signal processing 155 of the multiple A/D output signals.

The sampling process has essentially translated each of the narrow channels signal representations to baseband or a signal representation between 0 and 500 Hz (each is a digitized sample stream at 1000 Hz). In order to make a composite representation 160 of the entire input signal waveform 105, it is necessary to reconstruct a digital signal representation of each channel at its actual absolute lowpass equivalent frequency. The techniques for accomplishing this are well known in the art and may be accomplished, for example, by utilizing interpolation followed by appropriate filtering, or by utilizing interpolation and multiplying the resulting signal by a complex exponential to frequency shift the signal.

The first step is to translate each narrowband signal path back up to its proper frequency through interpolation. This may be accomplished using the bank of interpolators 130. Each interpolator 130 increases the sample rate of each signal by eight by introducing seven zero samples between each sample. This process creates multiple aliases of the baseband signal at multiples of 1000 Hz.

In addition, a bandpass filter bank 140 removes all but the desired aliased response. The digital representation of each narrowband channel, however, reflects only an approximation of the shaping response provided by the original analog anti-aliasing filter. Therefore, a well-controlled digital filtering operation 140 is applied to each narrowband signal path such that the desired amplitude and phase control over a precise portion of the segment is provided so that an accurate digital representation of the original signal can be created by the combination of the independent narrowband channels. Such filters 140 which provide the desired passband and transition characteristics are well known in the signal processing art and are known as quadrature mirror filters (or polyphase filters). These quadrature mirror filters (and other digital processing operations) are described in an article by P.P. Vaidyanathan called "Quadrature Mirror Filter Banks, M-Band Extensions and Perfect Reconstruction Techniques" in IEEE ASSP Magazine of July 1987 on pages 4–20. These filter characteristics are properly applied in the reconstruction filter bank 140. It will be appreciated by those skilled in the art that the quadrature mirror filtering function can be separated from the reconstruction filtering function described therein.

Finally, an accurate digital representation of the original wideband signal 105 is obtained by linearly combining 150 each of the outputs of the filter bank 140. In the preferred embodiment, this is accomplished by simply adding the Nth sample from each of the digital filter banks. The result is a composite signal 160 having a sample rate equal to that of the interpolated signal (i.e., 8 KHz in the preferred embodiment). In addition, the composite signal 160 will also have a frequency spectrum that extends from 250 Hz to 2750 Hz.

Although the invention has been described and illustrated with a certain degree of particularity, it is understood that the present disclosure of embodiments has been made by way of example only and that numerous changes in the arrangement and combination of parts as well as steps may be resorted to by those skilled in the art without departing from the spirit and scope of the invention as claimed. For example, the preferred embodiment digitizer as shown included ten narrowband signal paths which were subsequently combined into a single digitized wideband signal. However, as will be understood by those skilled in the art, any number of narrowband receiver paths may be combined into a single digitized wideband signal. In addition, more than one wideband signal path may be formed from the several narrowband signal paths. Further, anti-aliasing filter imperfections may be corrected in a subsequent digital signal processing function. Furthermore, the sequence in which the signal mixing and filtering function are performed may be altered without departing from the scope and spirit of the present invention. Finally, it should be recognized that it is not necessary to digitize and sample the signals with the same sampling frequency. It is well known in the art how to manipulate through digital signal processing a sampled signal to any desired signal sampling frequency, through the processes of decimation, filtering, and interpolation. It is also well known how to combine multiple signals with different sampling rates to create a representation of a composite signal.

What is claimed is:

1. A digitizer for digitizing a wide frequency bandwidth signal, comprising:
   (a) a plurality of filtering means for separating the wide frequency bandwidth signal into a plurality of narrow frequency bandwidth signals;
   (b) a converting means, operatively coupled to each of the filtering means, for generating digitized samples of the narrow frequency bandwidth signals; and
   (c) combining means, operatively coupled to the converting means, for combining the digitized samples and outputting a composite digitized signal having substantially the same spectral characteristics in digital form as the wide frequency bandwidth signal.

2. A method for digitizing a wide frequency bandwidth signal, comprising:
   (a) separating the wide frequency bandwidth signal into first and second narrow frequency bandwidth signals;
   (b) generating first and second digitized samples of the first and second narrow frequency bandwidth signals, respectively; and
   (c) generating a composite digitized signal from the first and second digitized samples which has substantially the same spectral characteristics in digital form as the wide frequency bandwidth signal.

3. The method of claim 2, wherein the step of separating the wide frequency bandwidth signal comprises selecting the first and second narrow frequency bandwidth signals from overlapping frequency portions of the wide frequency bandwidth signal.

4. The method of claim 2, wherein the step of generating a composite digitized signal comprises:
   (a) interpolating the first and second digitized samples to substantially a same sample rate as the first and second narrow frequency bandwidth signals, respectively;
   (b) filtering overlapping portions of the interpolated first and second digitized samples such that the filtered and interpolated first and second digitized samples form the composite digital signal; and (c) combining the filtered and restored first and second digitized signals into the composite digital signal.

5. A digitizer for digitizing an analog signal, comprising:
(a) first and second frequency selectors operable for selecting differing frequency portions of the analog signal and outputting first and second narrowband signals, respectively;
(b) first and second converters coupled to the first and second frequency selectors, respectively, and operable for generating a first and second digitized signal of the first and second narrowband signals, respectively; and
(c) a combiner coupled to the first and second converters and operable for combining the first and second digitized signals into a composite digital signal having substantially the same spectral characteristics in digital form as the analog signal.

6. The digitizer of claim 5, wherein the first and second frequency selectors are filters adapted for selecting overlapping portions of the analog signal.

7. The digitizer of claim 6, wherein the combiner comprises first and second interpolators coupled to the first and second converters, respectively, operable for restoring the first and second digitized signals to substantially a same sample rate as that of the frequency portions of the analog signal selected by the first and second frequency selectors, respectively.

8. The digitizer of claim 5, wherein the combiner comprises:
(a) first and second interpolators coupled to the first and second converters, respectively, operable for reconstructing the first and second digitized signals to a substantially equivalent lowpass frequency as the frequency portions of the analog signal selected by the first and second frequency selectors, respectively;
(b) first and second filters coupled to the first and second interpolators, respectively, operable for filtering overlapping portions of the reconstructed first and second digitized signals such that the filtered and reconstructed first and second digitized signals form the composite digital signal; and
(c) an adding circuit operable for combining the filtered and reconstructed first and second digitized signals into the composite digital signal.

9. A digitizer for digitizing a composite wideband analog signal formed of plural analog communication signals, comprising:
(a) plural filter means for separating the composite analog signal into a plurality of narrowband signals, at least a first subset of the plural filter means together passing a first of the plural analog communication signals;
(b) plural converting means, operatively coupled to the plural filter means, for generating digitized samples of the plurality of narrowband signals, including a first subset of converting means operatively coupled to the first subset of plural filter means;
(c) combining means, operatively coupled to the plural converting means, for combining the digitized samples and outputting at least a first digitized communication signal having substantially the same spectral characteristics in digital form as the first of the plural analog communication signals.

10. The digitizer of claim 9, wherein the plural filter means includes a second subset of the plural filter means together passing a second of the plural analog communication signals, the plural converting means includes a second subset of converting means operatively coupled to the second subset of plural filter means, and the combining means is further operable for outputting both the first digitized communication signal and a second digitized communication signal having substantially the same spectral characteristics in digital form as the second of the plural analog communication signals.

* * * * *